(12) United States Patent
Zhang et al.

(10) Patent No.: US 12,164,944 B2
(45) Date of Patent: Dec. 10, 2024

(54) ENHANCING ACCESSIBILITY OF TOPOLOGY DIAGRAM-RELATED APPLICATIONS

(71) Applicant: Microsoft Technology Licensing, LLC, Redmond, WA (US)

(72) Inventors: Xiao Zhang, Beijing (CN); Yucong Jin, Beijing (CN); Yue Huang, Beijing (CN); Ryan William Shugart, Seattle, WA (US); Sarah Higley, Seattle, WA (US); Jie Qiu, Beijing (CN); Zhixin Jin, Suzhou (CN)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 17/926,991

(22) PCT Filed: Jun. 16, 2020

(86) PCT No.: PCT/CN2020/096338
§ 371 (c)(1),
(2) Date: Nov. 21, 2022

(87) PCT Pub. No.: WO2021/253222
PCT Pub. Date: Dec. 23, 2021

(65) Prior Publication Data
US 2023/0195480 A1    Jun. 22, 2023

(51) Int. Cl.
*G06F 3/048* (2013.01)
*G06F 3/0481* (2022.01)
(Continued)

(52) U.S. Cl.
CPC ............ *G06F 9/453* (2018.02); *G06F 3/0481* (2013.01); *G06F 3/04842* (2013.01);
(Continued)

(58) Field of Classification Search
CPC ........ G06F 9/453; G06F 30/12; G06F 3/0481; G06F 3/04842; G06F 3/0489; G06F 3/167

See application file for complete search history.

(56) References Cited

U.S. PATENT DOCUMENTS

| 5,517,604 A | 5/1996 | Yuura et al. |
| 7,765,496 B2 | 7/2010 | Bernstein |

(Continued)

FOREIGN PATENT DOCUMENTS

| CN | 101114936 A | 1/2008 |
| CN | 102938706 A | 2/2013 |

(Continued)

OTHER PUBLICATIONS

Wu et al., Graphical Topology Autonomic Identification Method for Human-Machine Interface Modelling Based on Quadratic Space Mapping, 2020, IEEE, 14 pages.*

(Continued)

*Primary Examiner* — Linh K Pham
(74) *Attorney, Agent, or Firm* — Schwegman Lundberg & Woessner, P.A.

(57) ABSTRACT

Methods and apparatuses for enhancing accessibility of a target application which is for processing topology diagrams are provided. An indication of selecting a target element in a topology diagram may be received. Connection status of the target element may be determined based on topology information of the topology diagram. Connection information of the target element corresponding to the connection status of the target element may be generated. Description information of the target element may be provided to an accessibility assistant application, the description information of the target element at least comprising the connection information of the target element.

20 Claims, 9 Drawing Sheets

(51) Int. Cl.
  *G06F 3/04842*  (2022.01)
  *G06F 3/0489*  (2022.01)
  *G06F 3/16*  (2006.01)
  *G06F 9/451*  (2018.01)
  *G06F 30/12*  (2020.01)

(52) U.S. Cl.
  CPC ............ *G06F 3/0489* (2013.01); *G06F 3/167* (2013.01); *G06F 30/12* (2020.01)

(56) References Cited

U.S. PATENT DOCUMENTS

| | | | |
|---|---|---|---|
| 8,645,848 | B2 | 2/2014 | Lesh |
| 8,665,216 | B2 | 3/2014 | Karasin et al. |
| 8,984,476 | B2* | 3/2015 | Ng .............................. G06F 8/20 717/106 |
| 10,777,205 | B2* | 9/2020 | Wang .................... H04L 47/125 |
| 11,042,548 | B2* | 6/2021 | Griffith ............... G06F 21/6227 |
| 2007/0036294 | A1* | 2/2007 | Chaudhuri .......... H04M 3/4931 379/88.16 |
| 2009/0125846 | A1 | 5/2009 | Anderson et al. |
| 2011/0229020 | A1* | 9/2011 | Yoshii ............... G06F 18/24323 382/159 |
| 2013/0033643 | A1* | 2/2013 | Kim ..................... H04N 21/431 348/E5.097 |
| 2014/0019522 | A1* | 1/2014 | Weng ........................ G06N 5/02 709/203 |
| 2017/0177778 | A1* | 6/2017 | de Lescure ........... G06F 30/392 |
| 2017/0286383 | A1* | 10/2017 | Koul ..................... G06V 10/44 |
| 2019/0087724 | A1* | 3/2019 | Park ........................ G06N 5/02 |
| 2019/0384761 | A1* | 12/2019 | Nitta ....................... G06F 16/28 |
| 2020/0004737 | A1* | 1/2020 | Qiu ....................... G06F 16/245 |
| 2020/0150934 | A1* | 5/2020 | Webster ................ G10L 15/063 |

FOREIGN PATENT DOCUMENTS

| | | | |
|---|---|---|---|
| CN | 103413002 A | * | 11/2013 |
| CN | 109583064 A | * | 4/2019 ........... G06F 30/394 |

OTHER PUBLICATIONS

"First Office Action Issued in Chinese Patent Application No. 202080095928.6", Mailed Date: Jun. 6, 2023, 8 Pages.

"Make your Visio Diagram Accessible to People with Disabilities", Retrieved from: https://support.microsoft.com/en-us/office/make-your-visio-diagram-accessible-to-people-with-disabilities-e2c847a9-f010-4fef-af65-16e252829d44, Apr. 21, 2020, 17 Pages.

"Storyline 360: How to Design an Accessible Course", Retrieved from: https://articulate.com/support/article/Storyline-360-How-to-Design-an-Accessible-Course, Sep. 15, 2022, 11 Pages.

Grussenmeyer, et al., "AudioDraw: User Preferences in Non-Visual Diagram Drawing for Touchscreens", In Proceedings of the 13th Web for All Conference, Apr. 11, 2016, 8 Pages.

Lambate, et al., "Can Drag and Drop be Made Accessible? Yes! It can be in Different Ways!", Retrieved from: https://www.barrierbreak.com/can-drag-and-drop-be-made-accessible-yes-it-can-be-in-different-ways/#:~:text=be%20made%20accessible%3F-,Yes,can%20be%20in%20different%20ways!&text=We%20all%20often%20come%20across,functionality%20to%20complete%20our%20task, Oct. 17, 2018, 15 Pages.

"International Search Report and Written Opinion issued in PCT Application No. PCT/CN20/096338", Mailed Date: Mar. 17, 2021, 9 Pages.

"Diagramming Tool for Visually-Impaired Users", Retrieved from: https://oryano.com/phone-app-for-visually-imaired/, Mar. 26, 2016, 7 Pages.

Watkins, Dawn., "Web Accessibility 101: The Basics", Retrieved from: https://www.progress.com/blogs/web-accessibility-101-the-basics, May 23, 2018, 7 Pages.

Decision of Rejection Received for Chinese Application No. 202080095928.6, mailed on Apr. 20, 2024, 11 pages (English Translation Provided).

"Information Society", In Publication of ocean Press, Jan. 31, 2000, pp. 352-357.

Balik, "Combinatorial Graph Creation and Navigation for Blind People", accessed on Link https://www.csc2.ncsu.edu/techreports/tech/2011/TR-2011-1.pdf, Published on Feb. 4, 2011, retrieved on Jan. 17, 2024, 34 pages.

Search Report Received for European Application No. 20941073.7, mailed on Feb. 1, 2024, 8 pages.

Second Office Action Received for Chinese Application No. 202080095928.6, mailed on Nov. 25, 2023, 14 pages (English Translation Provided).

Communication pursuant to Rules 70 (2) and 70 a (2) EPC Received for European Application No. 20941073.7, mailed on Feb. 20, 2024, 1 Page.

* cited by examiner

ENHANCING ACCESSIBILITY OF TOPOLOGY DIAGRAM-RELATED APPLICATIONS

CROSS-REFERENCE TO RELATED APPLICATION

This application is a U.S. National Stage Filing under 35 U.S.C. 371 of International Patent Application Serial No. PCT/CN2020/096338, filed Jun. 16, 2020, and published as WO 2021/253222 A1 on Dec. 23, 2021, which application and publication are incorporated herein by reference in their entirety.

BACKGROUND

Accessibility of applications aims to make the applications be accessible by various users, including those users with disabilities, e.g., vision disability users, movement disability users, etc. For example, Web accessibility has been proposed for guiding the development or providing of web-based applications, content, etc. to be more friendly and accessible for disability users. Herein, the term "accessibility of applications" may widely comprise accessibility of various applications, e.g., accessibility of web-based applications, accessibility of non-web applications, etc. Moreover, the term "application" may widely cover various software, computer programs, widgets, etc.

SUMMARY

This Summary is provided to introduce a selection of concepts that are further described below in the Detailed Description. It is not intended to identify key features or essential features of the claimed subject matter, nor is it intended to be used to limit the scope of the claimed subject matter.

Embodiments of the present disclosure propose methods and apparatuses for enhancing accessibility of a target application which is for processing topology diagrams. An indication of selecting a target element in a topology diagram may be received. Connection status of the target element may be determined based on topology information of the topology diagram. Connection information of the target element corresponding to the connection status of the target element may be generated. Description information of the target element may be provided to an accessibility assistant application, the description information of the target element at least comprising the connection information of the target element.

It should be noted that the above one or more aspects comprise the features hereinafter fully described and particularly pointed out in the claims. The following description and the drawings set forth in detail certain illustrative features of the one or more aspects. These features are only indicative of the various ways in which the principles of various aspects may be employed, and this disclosure is intended to include all such aspects and their equivalents.

BRIEF DESCRIPTION OF THE DRAWINGS

The disclosed aspects will hereinafter be described in connection with the appended drawings that are provided to illustrate and not to limit the disclosed aspects.

DETAILED DESCRIPTION

Figure 1:
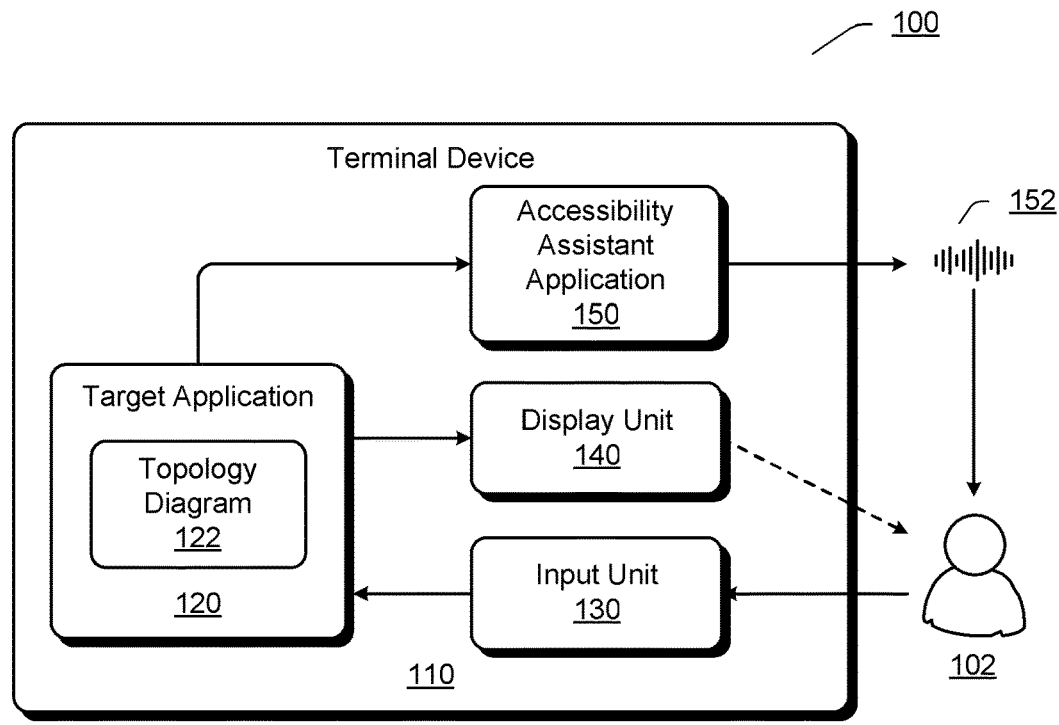
FIG. 1 illustrates an exemplary scenario of implementing application accessibility according to an embodiment.

The present disclosure will now be discussed with reference to several example implementations. It is to be understood that these implementations are discussed only for enabling those skilled in the art to better understand and thus implement the embodiments of the present disclosure, rather than suggesting any limitations on the scope of the present disclosure.

Various approaches have been proposed for implementing accessibility of applications. On one hand, a target application, for which accessibility is to provide, may be developed through providing layout, content, operation controls, etc. in a way of being easily understood or operated by disability users. On the other hand, an accessibility assistant application or tool may be adopted for further improving accessibility of the target application. For example, a vision disability user may use a voice-based accessibility assistant application to understand content in the target application. The voice-based accessibility assistant application may read out or narrate content or elements in a user interface (UI) of the target application in voice, such that the vision disability user may hear information helpful for understanding content or performing operations. The voice-based accessibility assistant application may be, e.g., screen reader, voice assistant, etc. Moreover, for example, a movement disability user may use a special keyboard as an accessibility assistant tool to navigate or perform operations in the target application without a mouse. Many special keyboards have been designed for movement disability users to assist their use of target applications.

Some target applications may be applied for processing topology-based diagrams, e.g., building, editing, or presenting topology diagrams. It is important and necessary to implement accessibility of such topology diagram-related applications, because topology diagrams usually contain a large amount of visual, structural, and logical information and it is much more difficult for disability users to understand, build, or edit the topology diagrams than normal users. Existing topology diagram-related applications can only provide limited accessibility to the disability users in traditional manners, even with the assistance by accessibility assistant applications or tools.

Embodiments of the present disclosure propose to enhance accessibility of a target application in a more effective approach, wherein the target application is a topology diagram-related application for processing topology diagrams. Herein, the topology diagrams may refer to various diagrams that contain multiple elements or components connected in a logical manner according to specific topology structures. An example of topology diagram is Directed Acyclic Graph (DAG) which is a directed graph having topological ordering. In the embodiments of the present disclosure, the topology diagrams may widely comprise, e.g., flow chart, organization chart, data flow diagram, work flow diagram, audit diagram, etc. According to the embodiments of the present disclosure, the topology diagram-related target application may prepare and provide rich description information related to elements in a topology diagram, to help disability users to take a full use of the application, e.g., understanding a topology diagram, building or editing a topology diagram, etc.

In one aspect, description information of an element in a topology diagram may help the disability users to understand structure, elements, connection relationship, processing flow, etc. in the topology diagram. The description information may be based at least on topology information of the topology diagram, and the topology information may comprise various information about topology structures, e.g., elements, connections among the elements, processing flows, etc. In the case of adopting an accessibility assistant application, e.g., screen reader, the description information from the target application may be read out or narrated in voice by the accessibility assistant application, such that the disability users, e.g., vision disability users, may hear desired useful information during navigating a topology diagram in the target application.

Accessibility assistance may be implemented in an interactive approach in which a disability user may be guided to navigate and understand a topology diagram according to connection relationship among elements in the topology diagram. It would be easier and more intuitive for the disability user to understand the topology diagram if the topology diagram is navigated along with connections among elements. For example, in response to a selection of an element in the topology diagram by the user, the target application may provide at least connection information of the element in the description information, which may help the user to intuitively understand the topology structure of the diagram and guide the user to navigate to the next element connected to the currently selected element. The description information may further comprise various other useful information, e.g., name, type, function, running status, etc. of the selected element. Moreover, prompts of executable operation may also be provided in the description information.

In another aspect, during a disability user is building a topology diagram, the embodiments of the present disclosure may utilize description information to assist the user to perform operations. For example, when an element is being edited, information about candidate connections of the element may be presented to the user through, e.g., a screen reader, thus helping the user to efficiently set connections for the edited element.

In a further aspect, keyboard shortcuts may be predefined in the target application, for facilitating the disability users, e.g., vision disability users, movement disability users, etc., to perform editing operations in the target application. Moreover, the disability users may also adopt voice input or voice instructions to interact with the target application and perform operations.

According to the embodiments of the present disclosure, description information related to topology information of topology diagrams may be provided to an accessibility assistant application and further presented to disability users. Keyboard shortcuts may be defined and adopted for the convenience of the disability users to perform various operations in target applications. Therefore, the accessibility of topology diagram-based applications may be significantly enhanced in terms of both understanding and building topology diagrams.

FIG. 1 illustrates an exemplary scenario 100 of implementing application accessibility according to an embodiment.

It is assumed that a user 102 is using a target application 120 through a terminal device 110. The user 102 may be a disability user, e.g., a vision disability user. The target application 120 is a topology diagram-related application which is capable of providing accessibility for disability users. A topology diagram 122 is currently being navigated or edited by the user 102. It should be appreciated that the target application 120 may be an application locally installed on the terminal device 110, a web application accessible via a browser in the terminal device 110, etc. Moreover, the target application 120 may be special software for diagram designing such as machine learning model/architecture building or designing software, etc., or productivity tools supporting topology diagram viewing or building such as Visio, etc., or any other types of applications or software related to topology diagrams.

The user 102 may provide inputs to the target application 120 through an input unit 130 in the terminal device 110, e.g., keyboard. Moreover, the UI of the target application 120 and the topology diagram 122 may be presented by a display unit 140 in the terminal device 110, e.g., display screen.

Since vision disability may result in that the user 102 could not observe exactly what are displayed by the display unit 140, and could not obtain full information of the topology diagram 122 from the display unit 140, an accessibility assistant application 150 on the terminal device 110 may be invoked and run during the user 102 is using the target application 120. The accessibility assistant application 150 may assist the user 102 to know what are displayed on the display unit 140, what element in the topology diagram 122 is operated by the user 102, etc. For example, when the user 102 selects, through the input unit 130, an element in the topology diagram 122, the target application 120 may provide description information of the selected element to the accessibility assistant application 150, and the accessibility assistant application 150 may narrate the description information in voice to form a voice segment 152. When the user 102 hears the voice segment 152, the user 102 may know relevant information of the selected element and thus can perform any further operations.

It should be appreciated that the scenario 100 is only exemplary, and there may be any other scenarios of implementing application accessibility. For example, instead of inputting through a keyboard, the user 102 may interact with the target application 120 through voice input or voice instruction. In this case, the input unit 130 may be a voice input unit with a microphone for collecting the user's voices. For example, although the input unit 130 is shown as incorporated in the terminal device 110, it may also be an external device connectable to the terminal device 110. Moreover, for example, when the user 102 is a movement disability user who can clearly see the content displayed on the display unit 140 but could not use a mouse, the input unit 130 may be a special keyboard which is designed for movement disability users as an accessibility assistant tool, and the voice-based accessibility assistant application 150 may be not run.

Figure 2:
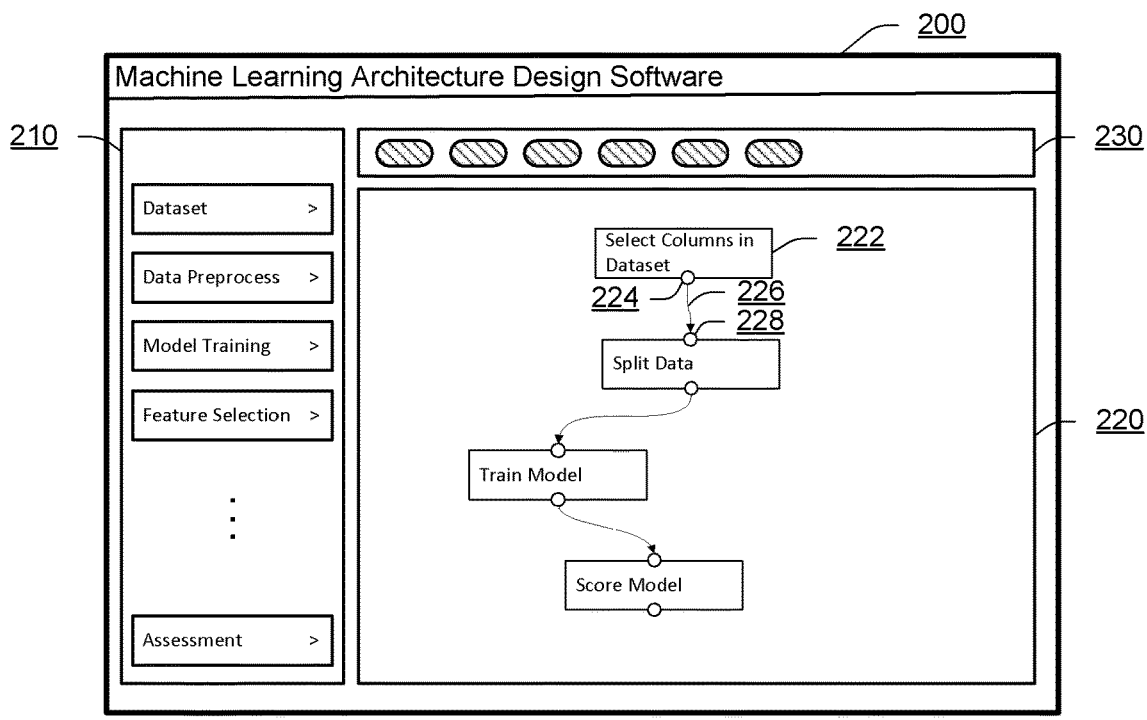
FIG. 2 illustrates an exemplary user interface (UI) of a topology diagram-related application.

FIG. 2 illustrates an exemplary UI 200 of a topology diagram-related application. The topology diagram-related application is an exemplary special software for designing or building machine learning model/architecture.

The UI 200 may comprise a module list 210. The module list 210 comprises a plurality of modules that can be selected to add to a topology diagram.

The UI 200 may comprise a canvas region 220 in which a topology diagram can be presented, built, etc. Usually, a topology diagram may contain three types of elements, including node, port and connection line. A node is a functional unit for performing specific processes and achieving specific functions, which is also called as "module" and selectable from the module list 210. A port refers to a part of a node that is responsible for establishing connections between the node and other nodes. A connection line is a directed connection path between two nodes or two ports. As shown in the canvas region 220, the topology diagram comprises a node 222 "Select Columns in Dataset", a port 224 of the node 222, a connection line 226 from the port 224 to a port 228 of a node "Split Data", etc.

The UI 200 may comprise a control panel 230. The control panel 230 comprises various buttons, icons, menus, etc. for performing control operations when processing the topology diagram in the canvas region 220.

The UI 200 may further comprise a side panel which is not shown in FIG. 2 or is hidden. The side panel may be used for, e.g., setting parameters for elements in the topology diagram, etc.

It should be appreciated that all the components and their layout in the UI 200 are exemplary, and depending on actual application requirements and designs, the UI 200 may be changed in various approaches. Moreover, different topology diagram-related applications may have respective UIs. Although the following discussions are provided mainly with reference to the application and UI in FIG. 2, the embodiments of the present disclosure are not limited to such exemplary application and UI, but can be implemented for any other topology diagram-related applications and their respective UIs.

Figure 3:
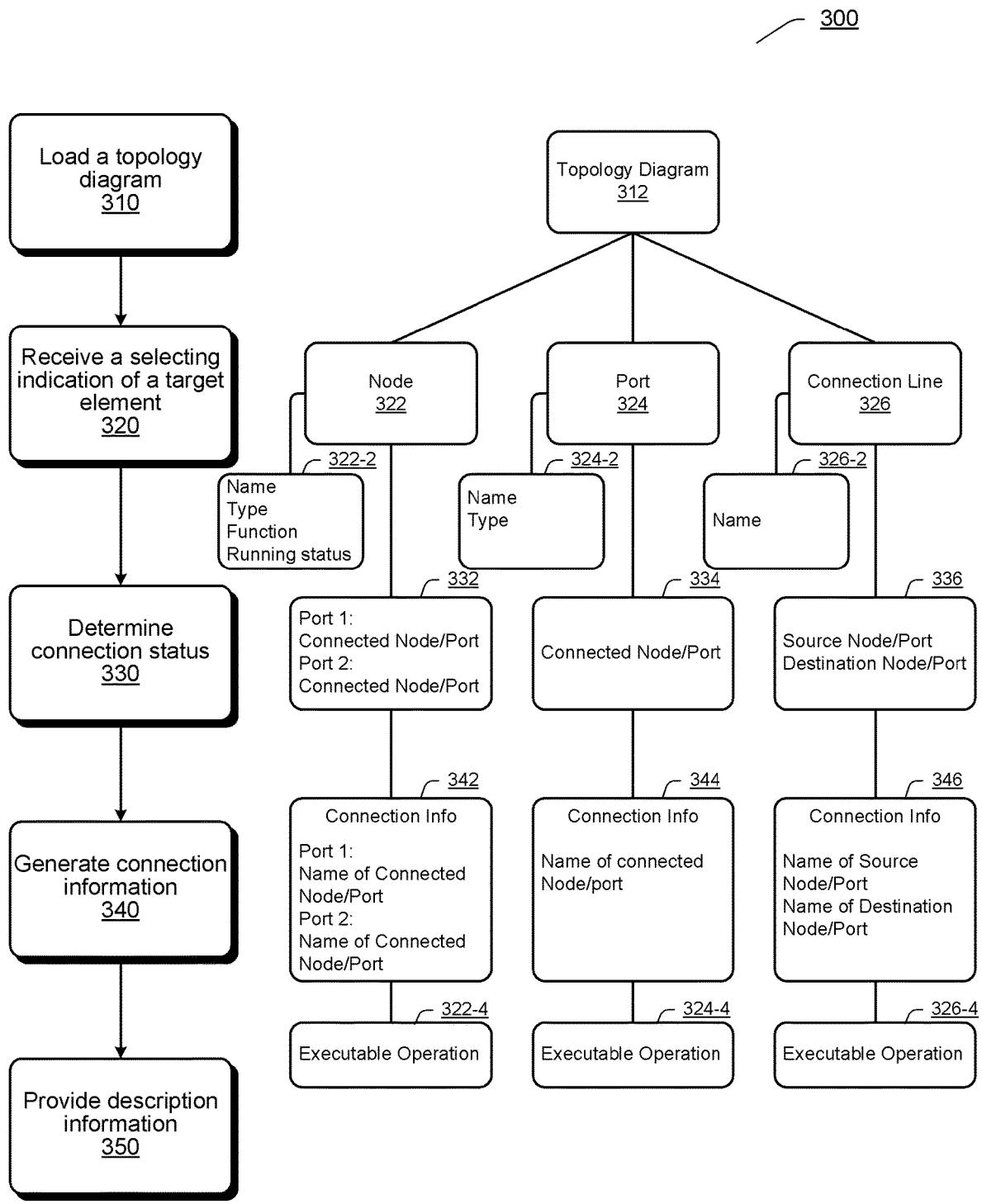
FIG. 3 illustrates an exemplary process for enhancing accessibility of a target application according to an embodiment.

FIG. 3 illustrates an exemplary process 300 for enhancing accessibility of a target application according to an embodiment. The process 300 may be performed in the target application for helping a disability user to understand a topology diagram in the target application.

At 310, a topology diagram may be loaded into the target application which is a topology diagram-related application. For example, a topology diagram 312 may be opened by the target application and displayed in a canvas region of the UI of the target application. The topology diagram 312 may be, e.g., a DAG.

After the topology diagram 312 is loaded, the user may desire to navigate and understand the topology diagram 312.

At 320, an indication of selecting a target element in the topology diagram 312 may be received. The selecting indication may be a keyboard input or voice input by the user through an input unit. For example, when the user wants to know information of an element in the topology diagram 312, the user may select the element through pressing a specific button or shortcuts in a keyboard, and then the element may be focused in the UI as a target element.

If the target element is a node 322 in the topology diagram 312, basic information 322-2 of the node 322 may be identified, which comprises, e.g., name, type, function, running status, etc. of the node 322. The name of the node 322 may be the same as the corresponding module in a module list of the target application, or the name shown in the topology diagram 312. The type of the node 322 may indicate a functional type in terms of what functions the node 322 performs, e.g., data processing, model, assessment, etc. The function of the node 322 may comprise detailed description of what the node 322 does, how the node 322 operates, etc. The running status of the node 322 may comprise status information about the running of the node, e.g., having been run or not, failed or successful, etc. Different node status information may be defined for different types of topology diagram.

If the target element is a port 324 of a node in the topology diagram 312, basic information 324-2 of the port 324 may be identified, which comprises, e.g., name, type, etc. of the port 324. The name of the port 324 may be an index of the port 324 in the node containing the port 324. For example, the node may comprise one or more ports, and each port may be designated a corresponding index, e.g., a numerical value, a letter, etc. The type of the port 324 may correspond to the type of the node containing the port 324, the type of data transferred through the port 324, etc.

If the target element is a connection line 326 in the topology diagram 312, basic information 326-2 of the connection line 326 may be identified, which comprises, e.g., name, etc. of the connection line 326. The name of the connection line 326 may be an index of the connection line 326 in the topology diagram 312, or a brief phrase formed with information of two connected nodes or ports.

It should be appreciated that basic information of the target element is not limited to the above examples, but may comprise any other information of the target element.

At 330, connection status of the target element may be determined based on topology information of the topology diagram 312. The target application may identify topology information from the loaded topology diagram 312 through, e.g., identifying elements contained in the topology diagram 312, connections among the elements, processing flows, etc. The topology information may be used for determining the connection status of the target element. For example, it may be determined from the topology information that to what node and/or port the target element connects.

Assuming that the target element is the node 322 and the node 322 has two ports, e.g., "Port 1" and "Port 2", connection status 332 of the node 322 may comprise nodes and/or ports connected by each of Port 1 and Port2. For example, the connection status 332 may comprise: a connected node and/or a connected port of the connected node corresponding to Port 1, a connected node and/or a connected port of the connected node corresponding to Port 2, etc.

Assuming that the target element is the port 324, connection status 334 of the port 324 may comprise, e.g., a connected node and/or a connected port of the connected node corresponding to the port 324, etc.

Assuming that the target element is the connection line 326, connection status 336 of the connection line 326 may comprise two nodes and/or ports connected through the connection line 326, e.g., a source node and/or a source port of the source node, a destination node and/or a destination port of the destination node, etc. The source node and/or port is the starting point of the connection line 326, and the destination node and/or port is the ending point of the connection line 326.

At 340, connection information corresponding to the connection status of the target element may be generated. In an implementation, the connection information may comprise the name of the connected node and/or port. For example, for the connection status 332, connection information 342 may be generated, which comprises, e.g., the name of the connected node and/or port corresponding to Port 1 of the node 322, the name of the connected node and/or port corresponding to Port 2 of the node 322, etc. For example, for the connection status 334, connection information 344 may be generated, which comprises, e.g., the name of the connected node and/or port corresponding to the port 324, etc. For example, for the connection status 336, connection information 346 may be generated, which comprises, e.g., the name of the source node and/or port, the name of the destination node and/or port, etc. It should be appreciated that connection information of the target element is not limited to the above examples, but may comprise any information about the connection status of the target element.

In an implementation, optionally, the process 300 may further comprise determining at least one executable operation based on the connection information of the target element. The executable operation may be various suggested operations for guiding the user to navigate the topology diagram 312 along with the topology structure of the topology diagram 312. For example, the connection information of the target element indicates the connected node and/or port corresponding to the target element, and thus the executable operation may aim to guide the user to navigate to the connected node and/or port. For example, in response to the generated connection information 342, an executable operation 322-4 for navigating to Port 1 and Port 2 through a specific keyboard shortcut may be determined. For example, in response to the generated connection information 344, an executable operation 324-4 for going to the connected node or port through a specific voice instruction may be determined. For example, in response to the generated connection information 346, an executable operation 326-4 for navigating to the destination node or port through a specific keyboard shortcut may be determined.

At 350, description information of the target element may be formulated and provided to an accessibility assistant application. The description information may comprise the connection information of the target element, and optionally comprise the basic information of the target element and/or the suggested executable operation. The accessibility assistant application may be used for providing accessibility assistance through narrating the description information. In an implementation, optionally, in order to make the description information more comprehensive, the process 300 may further comprise phrasing the connection information, the basic information, the executable operation, etc. in the form of natural language through any known natural language processing techniques.

When the user hears the narrated description information of the selected target element, the user may know relevant information of the target element and decide to perform a further operation accordingly. As an example, a second indication of selecting a second target element may be received from the user, wherein the second selecting indication may be based on the connection information in the description information of the current target element provided at 350. For example, the second target element may be the connected node or port corresponding to the current target element. Then the steps 320 to 350 in the process 300 may be performed again for further providing description information of the second target element.

Through performing the steps 320 to 350 in the process 300 iteratively to provide accessibility of the target application in an interactive approach, the user may be guided to navigate the topology diagram 312 according to connection relationship among elements, and thus may easily understand the topology diagram 312.

Figure 4:
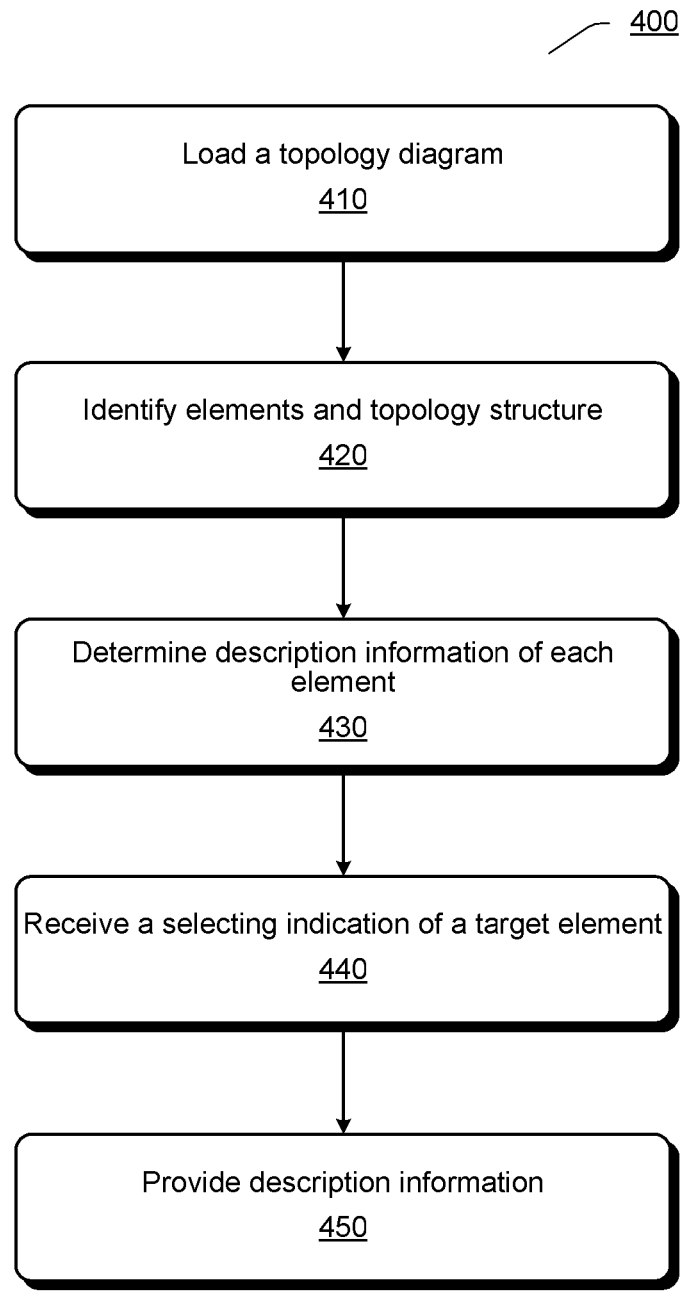
FIG. 4 illustrates an exemplary process for enhancing accessibility of a target application according to an embodiment.

FIG. 4 illustrates an exemplary process 400 for enhancing accessibility of a target application according to an embodiment. The process 400 is a variant of the process 300 in FIG. 3.

At 410, a topology diagram may be loaded to the target application.

At 420, all the elements in the topology diagram and topology structure of the topology diagram may be identified from the topology diagram.

At 430, description information of each element may be determined. For example, the description information of each element may be determined in a similar way with the formulating of the description information of the target element as discussed above in connection with the process 300.

At 440, an indication of selecting a target element in the topology diagram may be received.

At 450, in response to the received selecting indication, description information of the target element may be provided to an accessibility assistant application. The description information of the target element may be retrieved from the description information of all the elements determined at 430.

The steps 440 and 450 in the process 400 may be performed iteratively in response to receiving further selecting indications.

Through the process 400, description information of all the elements in the topology diagram may be determined and prepared upon the topology diagram is loaded. Thus, when receiving a selecting indication of a target element, description information of the target element may be directly provided in a faster speed.

Figure 5:
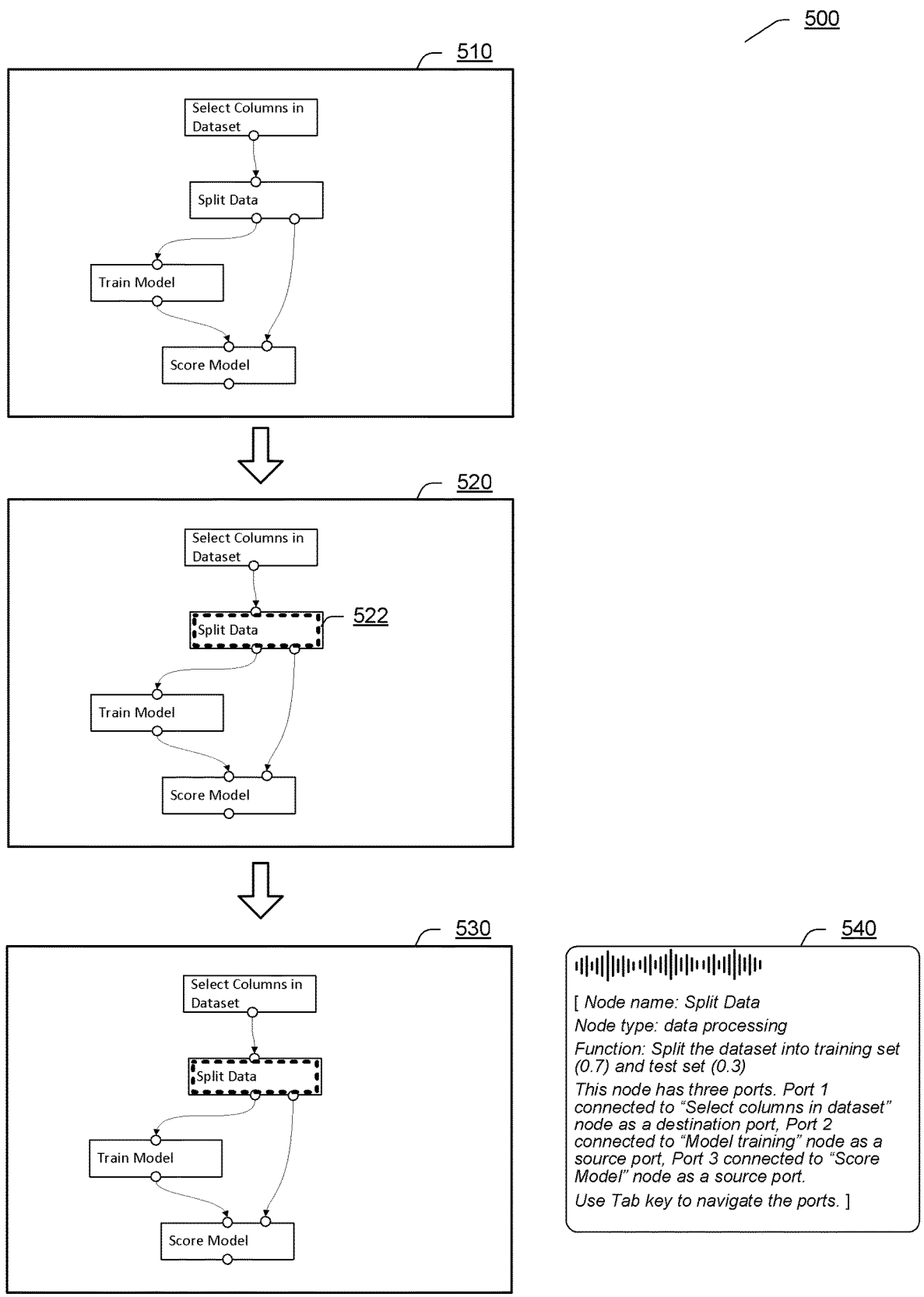
FIG. 5 illustrates an example of enhancing application accessibility according to an embodiment.

FIG. 5 illustrates an example 500 of enhancing application accessibility according to an embodiment. The example 500 aims to show the process of helping a disability user to understand a topology diagram in a target application according to the process 300 in FIG. 3 or the process 400 in FIG. 4. The example 500 is provided with reference to the exemplary topology diagram-related application in FIG. 2. For the sake of illustration, only canvas region in the UI of the target application is shown in the example 500.

In an exemplary screenshot 510 of the canvas region, a topology diagram is shown as loaded to the target application.

Then the target application may receive an indication of selecting a target element, e.g., the node "Split Data", in the topology diagram. In an exemplary next screenshot 520 of the canvas region, the node "Split Data" is focused and highlighted by a dotted block 522 in the topology diagram, which indicates that this node is currently selected.

The target application may provide description information of the node "Split Data" to an accessibility assistant application according to the process 300 in FIG. 3 or the process 400 in FIG. 4. As shown in an exemplary next screenshot 530 of the canvas region, the content in the canvas region remains the same as the screen shot 520, but the description information of the node "Split Data" is narrated by the accessibility assistant application in a voice segment 540. As an example, the description information in the voice segment 540 may comprise name "Split Data", type "data processing", function "Split the dataset . . . and test set (0.3)", connection information "This node has three ports . . . Port 3 connected to 'Score Model' node as a source port", and an executable operation "Use Tab key to navigate the ports".

Figure 6:
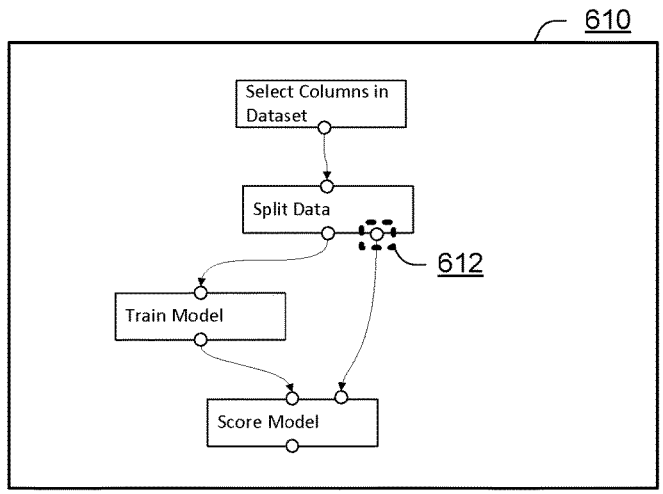
FIG. 6 illustrates a further example of enhancing application accessibility according to an embodiment.
Figure 6:
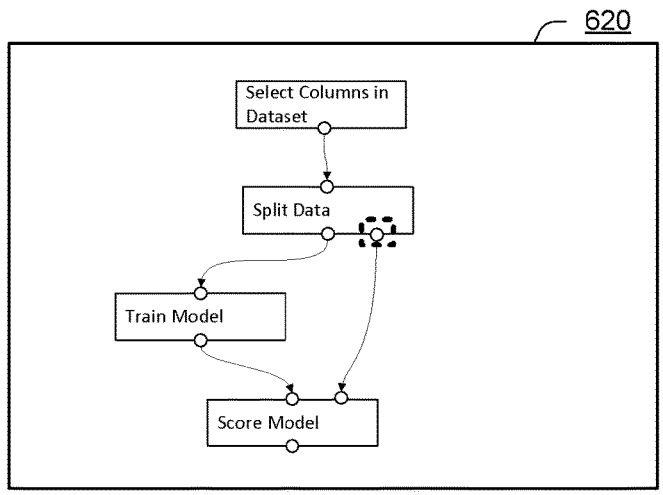
Figure 6:
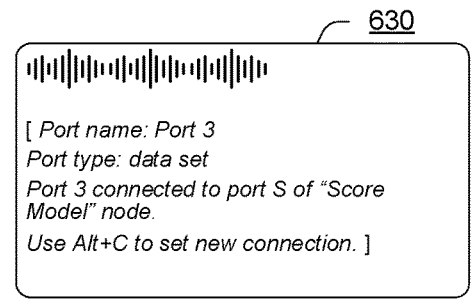

FIG. 6 illustrates a further example 600 of enhancing application accessibility according to an embodiment. The example 600 is a continuation of the example 500 in FIG. 5.

Assuming that the user performs the executable operation "Use Tab key to navigate the ports" as suggested in the description information in FIG. 5, an exemplary screenshot 610 of the canvas region may appear accordingly. As shown in the screenshot 610, Port 3 of the node "Split Data" is focused and highlighted by a dotted block 612 in the topology diagram, which indicates that this port is currently selected.

The target application may provide description information of Port 3 of the node "Split Data" to the accessibility assistant application according to the process 300 in FIG. 3 or the process 400 in FIG. 4. As shown in an exemplary next screenshot 620 of the canvas region, the content in the canvas region remains the same as the screen shot 610, but the description information of Port 3 is narrated by the accessibility assistant application in a voice segment 630. As an example, the description information in the voice segment 630 may comprise name "Port 3", type "data set", connection information "Port 3 connected to port S of 'Score Model' node", and an executable operation "Use Alt+C to set new connection".

It should be appreciated that all the details in the example 500 of FIG. 5 and the example 600 of FIG. 6 are exemplary, and various changes may be made to these examples. For example, although the target element is shown as highlighted by the dotted block, the target element may also be highlighted in any other visual approaches.

According to the embodiments of the present disclosure, the accessibility of topology diagram-based applications may also be enhanced in terms of building topology diagrams. A target application may receive at least one editing operation from a disability user, and in response to a series of editing operations, a topology diagram may be built in the target application. The editing operations may be provided through predefined keyboard shortcuts, voice instructions, etc. The editing operations may comprise various operations involved in the building or editing of the topology diagram, e.g., selecting elements, setting connections for elements, setting parameters for elements, etc. During the disability user is building the topology diagram, description information of edited elements may also be presented to the user through an accessibility assistant application so as to help the user to efficiently accomplish editing operations. For example, when a port of a node is selected and focused, and an editing operation of setting connections for the focused port is received, information about at least one candidate node and/or port connectable by the focused port may be provided, in the description information of the focused port, to the accessibility assistant application and further narrated by the accessibility assistant application, thus the user may efficiently set a connection for the focused port with reference to the candidate connectable node/port suggested in the narrated description information. Optionally, the candidate node/port may also be highlighted in the canvas region to facilitate the user to set connections. It should be appreciated that the candidate connectable node/port may be determined based on, e.g., matching between types of two elements. For example, if a type of a node/port matches with the focused port, i.e., a connection may be established between them, the node/port may be determined as a candidate node/port.

Figure 7:
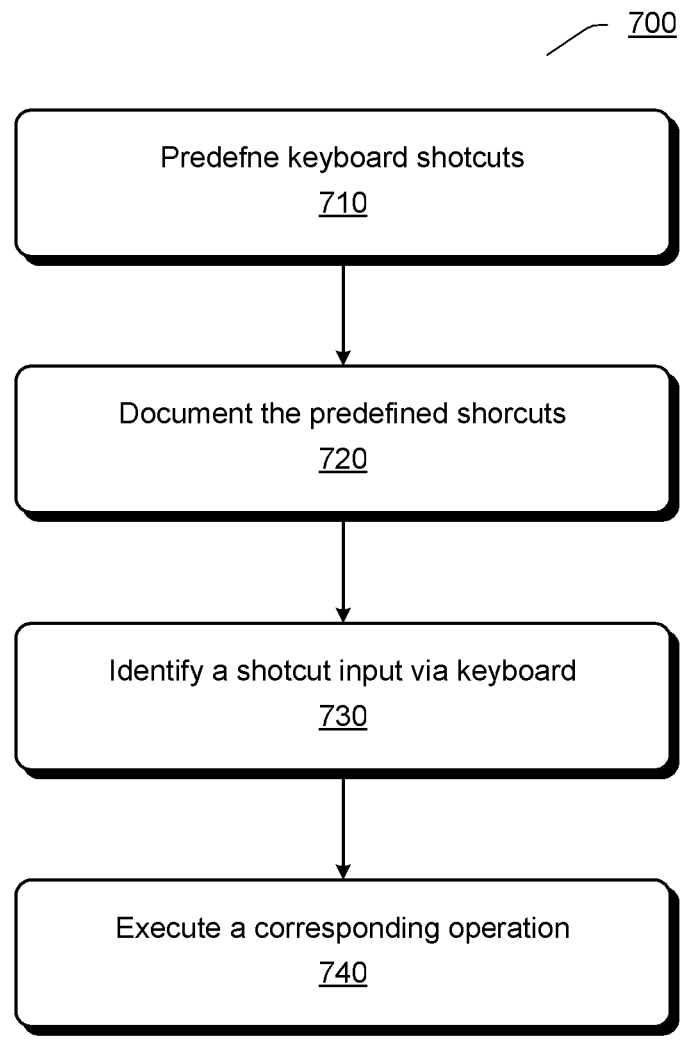
FIG. 7 illustrates an exemplary process for assisting disability users to build a topology diagram with predefined keyboard shortcuts according to an embodiment.

FIG. 7 illustrates an exemplary process 700 for assisting disability users to build a topology diagram with predefined keyboard shortcuts according to an embodiment.

At 710, various keyboard shortcuts may be predefined for a target application. In an implementation, a shortcut for switching focus between a canvas region and a module list in the UI of a target application or for switching focus among the modules in the module list may be defined, e.g., a combination of the keys "Ctrl", "Shift" and "F6". In an implementation, a shortcut for inserting a selected node into the canvas region may be defined, e.g., the key "Enter". In an implementation, a shortcut for starting to set connections may be defined, e.g., a combination of the keys "Alt" and "C". In an implementation, a shortcut for opening a side panel for setting parameters of an element may be defined, e.g., a combination of the keys "Ctrl", "Shift" and "E". It should be appreciated that all the above shortcuts are exemplary, and any other shortcuts for the ease of building topology diagrams by disability users may be defined.

At 720, the predefined shortcuts may be documented publicly, such that all the users may get to know the predefined shortcuts.

At 730, during a user is building or editing a topology diagram, the target application may identify a shortcut input via keyboard, which may be an editing operation desired by the user.

At 740, the target application may execute an operation corresponding to the identified shortcut input, thus accomplishing the desired editing operation.

Through performing the steps 730 and 740 iteratively, a keyboard user, e.g., a disability user, may build a topology diagram through a keyboard.

It should be appreciated that, in a similar approach with the process 700, voice instructions may also be predefined and used for building topology diagrams by voice-input users. Moreover, keyboard shortcuts and voice instructions may also be used in combination so as to provide more flexible input approaches.

Figure 8:
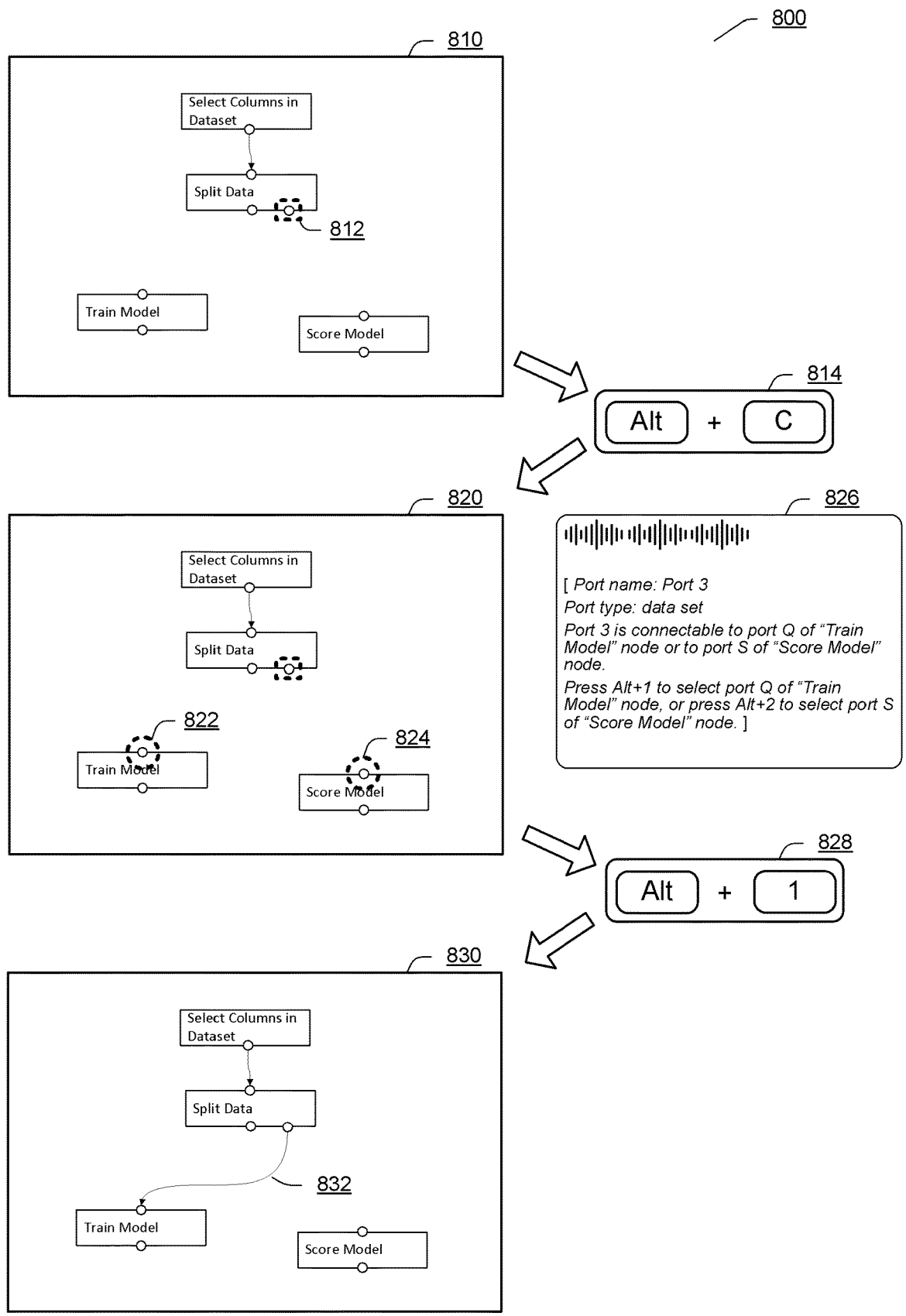
FIG. 8 illustrates an example of enhancing application accessibility according to an embodiment.

FIG. 8 illustrates an example 800 of enhancing application accessibility according to an embodiment. The example 800 aims to show the process of helping a disability user to build a topology diagram in a target application. The example 800 is provided with reference to the exemplary topology diagram-related application in FIG. 2. For the sake of illustration, only canvas region in the UI of the target application is shown in the example 800.

In an exemplary screenshot 810 of the canvas region, Port 3 of a node "Split Data" is focused and highlighted by a dotted block 812, which indicates that this port is currently being selected and edited.

Assuming that a keyboard shortcut input 814, e.g., a combination of the keys "Alt" and "C", is then identified, which corresponds to an editing operation of setting connections for the focused Port 3.

In an exemplary next screenshot 820 of the canvas region, two candidate ports, e.g., Port Q of a node "Train Model" and Port S of a node "Score Model", are highlighted by dotted circles 822 and 824 respectively which indicate that these two ports may be connected by the focused Port 3 of the node "Split Data". Meanwhile, the target application may provide description information of Port 3 of the node "Split Data" to an accessibility assistant application, which comprises the information of the two candidate ports. The description information of Port 3 is narrated by the accessibility assistant application in a voice segment 826. As an example, the description information in the voice segment 826 may comprise name "Port 3", type "data set", connection information "Port 3 is connectable to Port Q of 'Train Model' node or to Port S of 'Score Model' node", executable operations "Press Alt+1 to select Port Q of 'Train Model' node, or press Alt+2 to select Port S of 'Score Model' node", etc. Information of the two candidate ports is included in at least the connection information part and the executable operation part of the description information of Port 3.

Assuming that a keyboard shortcut input 828, e.g., a combination of the keys "Alt" and "1", is then identified, which corresponds to a selection by the user of Port Q of the node "Train Model" which is desired to be connected to the focused Port 3. Then, the target application may automatically set a connection from Port 3 of the node "Split Data" to Port Q of the node "Train Model", as shown by the connection line 832 in an exemplary next screenshot 830 of the canvas region.

It should be appreciated that all the details in the example 800 of FIG. 8 are exemplary, and various changes may be made to the example. For example, although the candidate ports are shown as highlighted by the dotted circles, the candidate ports may also be highlighted in any other visual approaches. For example, instead of suggesting connectable candidate ports in the description information of the focused Port 3, connectable candidate nodes, e.g., the node "Train Model" and the node "Score Model", may also be suggested in the description. For example, although only keyboard shortcuts are involved in the example 800, voice instructions or combinations of keyboard shortcuts and voice instructions may be adopted by the user instead.

Figure 9:
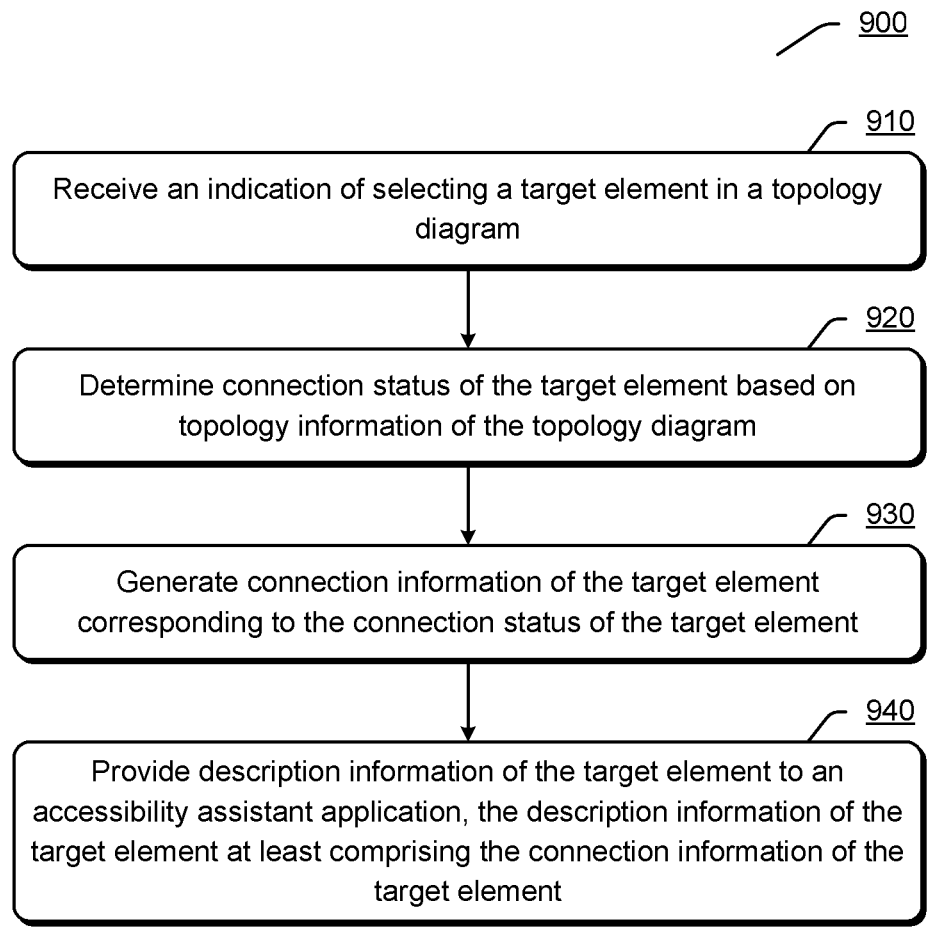
FIG. 9 illustrates a flowchart of an exemplary method for enhancing accessibility of a target application according to an embodiment.

FIG. 9 illustrates a flowchart of an exemplary method 900 for enhancing accessibility of a target application according to an embodiment. The target application may be for processing topology diagrams.

At 910, an indication of selecting a target element in a topology diagram may be received.

At 920, connection status of the target element may be determined based on topology information of the topology diagram.

At 930, connection information of the target element corresponding to the connection status of the target element may be generated.

At 940, description information of the target element may be provided to an accessibility assistant application, the description information of the target element at least comprising the connection information of the target element.

In an implementation, the target element may be one of: node, port and connection line.

In an implementation, the determining connection status of the target element may comprise: identifying at least one node and/or port connected by the target element. The connection information may comprise: name of the at least one node and/or port.

In an implementation, the description information may further comprise at least one of: name of the target element, type of the target element, function of the target element, and running status of the target element.

In an implementation, the description information may further comprise at least one executable operation.

In an implementation, the method 900 may further comprise: receiving a second indication of selecting a second target element indicated by the connection information of the target element; and providing description information of the second target element to the accessibility assistant application.

The method 900 may further comprise: determining connection status of the second target element based on the topology information of the topology diagram; and generating connection information of the second target element corresponding to the connection status of the second target element. The description information of the second target element may at least comprise the connection information of the second target element.

In an implementation, the indication may be provided through keyboard input or voice input.

In an implementation, the method 900 may further comprise: receiving at least one editing operation; and in response to the at least one editing operation, building the topology diagram.

The at least one editing operation may be provided through predefined keyboard shortcuts and/or voice instructions.

The at least one editing operation may comprise an operation of setting connection for a focused port of a node. The method 900 may further comprise: providing, to the accessibility assistant application, information of at least one candidate node and/or port connectable by the focused port.

The method 900 may further comprise: highlighting the at least one candidate node and/or port.

In an implementation, the accessibility assistant application may be for providing accessibility assistance through narrating the description information.

In an implementation, the topology diagram may be a directed acyclic graph (DAG).

It should be appreciated that the method 900 may further comprise any steps/processes for enhancing accessibility of a topology diagram-related target application according to the embodiments of the present disclosure as mentioned above.

Figure 10:
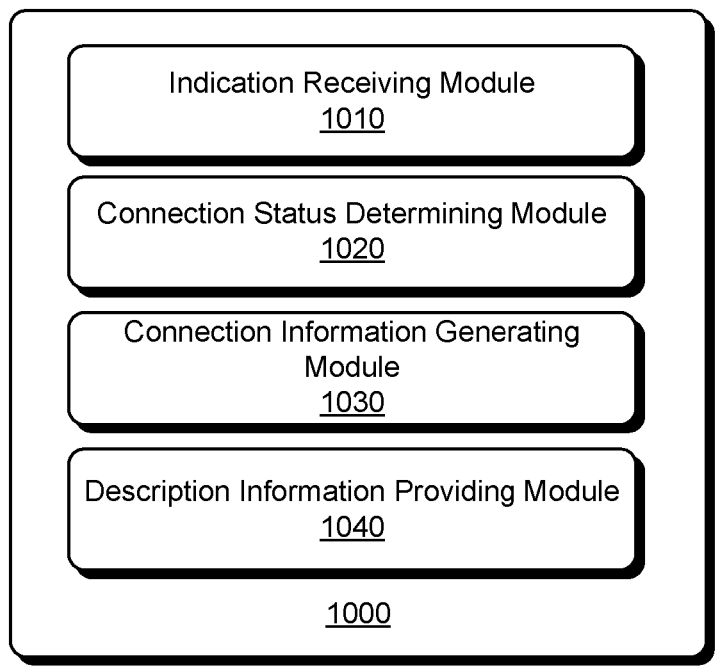
FIG. 10 illustrates an exemplary apparatus for enhancing accessibility of a target application according to an embodiment.

FIG. 10 illustrates an exemplary apparatus 1000 for enhancing accessibility of a target application according to an embodiment. The target application may be for processing topology diagrams.

The apparatus 1000 may comprise: an indication receiving module 1010, for receiving an indication of selecting a target element in a topology diagram; a connection status determining module 1020, for determining connection status of the target element based on topology information of the topology diagram; a connection information generating module 1030, for generating connection information of the target element corresponding to the connection status of the target element; and a description information providing module 1040, for providing description information of the target element to an accessibility assistant application, the description information of the target element at least comprising the connection information of the target element.

In an implementation, the connection status determining module 1020 may be for: identifying at least one node and/or port connected by the target element. The connection information may comprise: name of the at least one node and/or port.

In an implementation, the description information may further comprise at least one of: name of the target element, type of the target element, function of the target element, and running status of the target element.

In an implementation, the description information may further comprise at least one executable operation.

In an implementation, the indication receiving module 1010 may be for receiving a second indication of selecting a second target element indicated by the connection information of the target element. The description information providing module 1040 may be for providing description information of the second target element to the accessibility assistant application.

In an implementation, the apparatus 1000 may further comprise: an editing operation receiving module, for receiving at least one editing operation; and a diagram building module for, in response to the at least one editing operation, building the topology diagram.

Moreover, the apparatus 1000 may also comprise any other modules configured for enhancing accessibility of a topology diagram-related target application according to the embodiments of the present disclosure as mentioned above.

Figure 11:
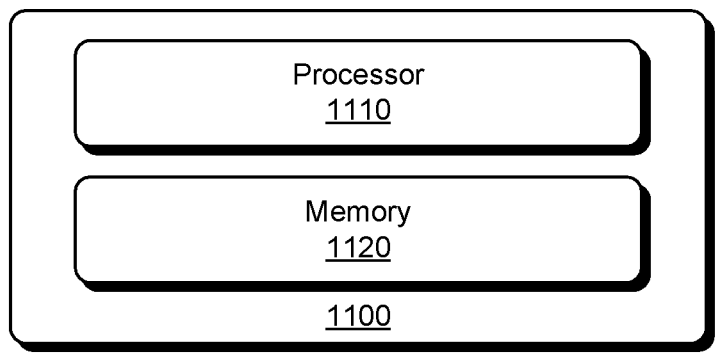
FIG. 11 illustrates an exemplary apparatus for enhancing accessibility of a target application according to an embodiment.

FIG. 11 illustrates an exemplary apparatus 1100 for enhancing accessibility of a target application according to an embodiment. The target application may be for processing topology diagrams.

The apparatus 1100 may comprise at least one processor 1110 and a memory 1120 storing computer-executable instructions. When executing the computer-executable instructions, the at least one processor 1110 may perform any operations of the methods for enhancing accessibility of a topology diagram-related target application according to the embodiments of the present disclosure as mentioned above.

The embodiments of the present disclosure may be embodied in a non-transitory computer-readable medium. The non-transitory computer-readable medium may comprise instructions that, when executed, cause one or more processors to perform any operations of the methods for enhancing accessibility of a topology diagram-related target application according to the embodiments of the present disclosure as mentioned above.

It should be appreciated that all the operations in the methods described above are merely exemplary, and the present disclosure is not limited to any operations in the methods or sequence orders of these operations, and should cover all other equivalents under the same or similar concepts.

It should also be appreciated that all the modules in the apparatuses described above may be implemented in various approaches. These modules may be implemented as hardware, software, or a combination thereof. Moreover, any of these modules may be further functionally divided into sub-modules or combined together.

Processors have been described in connection with various apparatuses and methods. These processors may be implemented using electronic hardware, computer software, or any combination thereof. Whether such processors are implemented as hardware or software will depend upon the particular application and overall design constraints imposed on the system. By way of example, a processor, any portion of a processor, or any combination of processors presented in the present disclosure may be implemented with a microprocessor, microcontroller, digital signal processor (DSP), a field-programmable gate array (FPGA), a programmable logic device (PLD), a state machine, gated logic, discrete hardware circuits, and other suitable processing components configured to perform the various functions described throughout the present disclosure. The functionality of a processor, any portion of a processor, or any combination of processors presented in the present disclosure may be implemented with software being executed by a microprocessor, microcontroller, DSP, or other suitable platform.

Software shall be construed broadly to mean instructions, instruction sets, code, code segments, program code, programs, subprograms, software modules, applications, software applications, software packages, routines, subroutines, objects, threads of execution, procedures, functions, etc. The software may reside on a computer-readable medium. A computer-readable medium may include, by way of example, memory such as a magnetic storage device (e.g., hard disk, floppy disk, magnetic strip), an optical disk, a smart card, a flash memory device, random access memory (RAM), read only memory (ROM), programmable ROM (PROM), erasable PROM (EPROM), electrically erasable PROM (EEPROM), a register, or a removable disk. Although memory is shown separate from the processors in the various aspects presented throughout the present disclosure, the memory may be internal to the processors, e.g., cache or register.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein. All structural and functional equivalents to the elements of the various aspects described throughout the present disclosure that are known or later come to be known to those of ordinary skilled in the art are intended to be encompassed by the claims.

What is claimed is:

1. A method for enhancing accessibility of a target application, the target application being for processing topology diagrams, the method comprising:
   receiving an indication of selecting a target element in a topology diagram, the topology diagram comprising a plurality of nodes, one or more ports in each node, and connections between ports, the target element being one of a node, a port, or a connection;
   determining connection status of the target element based on topology information of the topology diagram, wherein the connection status of a node comprises connection information of the ports in the node, wherein the connection status of a port comprises information on connected ports and nodes associated with the connected ports, wherein the connection status of a connection comprises nodes or ports connected via the connection;
   generating connection information of the target element corresponding to the connection status of the target element, the connection information of the target element comprising information on nodes and ports connected to the target element and the corresponding connections; and
   providing description information of the target element to an accessibility assistant application, the description information of the target element at least comprising the connection information of the target element.

2. The method of claim 1, wherein the target element is one of: node, port and connection line.

3. The method of claim 1, wherein the determining connection status of the target element comprises:
   identifying at least one node or port connected by the target element, wherein the connection information comprises a name of the at least one node and/or or port.

4. The method of claim 1, wherein the description information further comprises at least one of: name of the target element, type of the target element, function of the target element, and running status of the target element.

5. The method of claim 1, wherein the description information further comprises at least one executable operation.

6. The method of claim 1, further comprising:
receiving a second indication of selecting a second target element indicated by the connection information of the target element; and
providing description information of the second target element to the accessibility assistant application.

7. The method of claim 6, further comprising:
determining connection status of the second target element based on the topology information of the topology diagram; and
generating connection information of the second target element corresponding to the connection status of the second target element, wherein the description information of the second target element at least comprises the connection information of the second target element.

8. The method of claim 1, wherein the indication is provided through keyboard input or voice input.

9. The method of claim 1, further comprising:
receiving at least one editing operation; and
in response to the at least one editing operation, building the topology diagram.

10. The method of claim 9, wherein the at least one editing operation is provided through predefined keyboard shortcuts or voice instructions.

11. The method of claim 9, wherein the at least one editing operation comprises an operation of setting connection for a focused port of a node, wherein the method further comprises:
providing, to the accessibility assistant application, information of at least one candidate node a or port connectable by the focused port.

12. The method of claim 11, further comprising:
highlighting the at least one candidate node or port.

13. The method of claim 1, wherein the accessibility assistant application is for providing accessibility assistance through narrating the description information.

14. The method of claim 1, wherein the topology diagram is a directed acyclic graph (DAG).

15. A system for enhancing accessibility of a target application, the target application being for processing topology diagrams, the system comprising:
a memory comprising instructions; and
one or more computer processors, wherein the instructions, when executed by the one or more computer processors, cause the system to perform operations comprising:
receiving an indication of selecting a target element in a topology diagram, the topology diagram comprising a plurality of nodes, one or more ports in each node, and connections between ports, the target element being one of a node, a port, or a connection;
determining connection status of the target element based on topology information of the topology diagram, wherein the connection status of a node comprises connection information of the ports in the node, wherein the connection status of a port comprises information on connected ports and nodes associated with the connected ports, wherein the connection status of a connection comprises nodes or ports connected via the connection;
generating connection information of the target element corresponding to the connection status of the target element, the connection information of the target element comprising information on nodes and ports connected to the target element and the corresponding connections; and
providing description information of the target element to an accessibility assistant application, the description information of the target element at least comprising the connection information of the target element.

16. The system of claim 15, wherein the determining connection status of the target element comprises:
identifying at least one node or port connected by the target element, wherein the connection information comprises a name of the at least one node and/or or port.

17. The system of claim 15, wherein the description information further comprises at least one of: name of the target element, type of the target element, function of the target element, and running status of the target element.

18. The system of claim 15, wherein the description information further comprises at least one executable operation.

19. The system of claim 15, wherein the instructions further cause the one or more computer processors to perform operations comprising:
receiving a second indication of selecting a second target element indicated by the connection information of the target element; and
providing description information of the second target element to the accessibility assistant application.

20. The system of claim 15, wherein the instructions further cause the one or more computer processors to perform operations comprising:
receiving at least one editing operation; and
in response to the at least one editing operation, building the topology diagram.

* * * * *